(12) United States Patent
Nakamura

(10) Patent No.: US 12,084,288 B2
(45) Date of Patent: Sep. 10, 2024

(54) CONVEYANCE ABNORMALITY PREDICTION SYSTEM

(71) Applicant: EBARA CORPORATION, Tokyo (JP)

(72) Inventor: Akira Nakamura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 129 days.

(21) Appl. No.: 17/765,374

(22) PCT Filed: Sep. 18, 2020

(86) PCT No.: PCT/JP2020/035501
§ 371 (c)(1),
(2) Date: Mar. 30, 2022

(87) PCT Pub. No.: WO2021/065576
PCT Pub. Date: Apr. 8, 2021

(65) Prior Publication Data
US 2022/0363487 A1 Nov. 17, 2022

(30) Foreign Application Priority Data
Oct. 2, 2019 (JP) ................................ 2019-181870

(51) Int. Cl.
*H05K 13/02* (2006.01)
*B65G 43/02* (2006.01)

(52) U.S. Cl.
CPC ...... *B65G 43/02* (2013.01); *B65G 2203/0275* (2013.01); *B65G 2203/0291* (2013.01); *B65G 2203/044* (2013.01); *B65G 2203/045* (2013.01)

(58) Field of Classification Search
CPC ............ B65G 43/02; B65G 2203/0275; B65G 2203/044; H05K 13/02
See application file for complete search history.

(56) References Cited

U.S. PATENT DOCUMENTS

| | | | |
|---|---|---|---|
| 6,925,356 B2* | 8/2005 | Schauer | H01L 21/67259 700/218 |
| 7,486,878 B2* | 2/2009 | Chen | H01L 21/681 396/419 |

(Continued)

FOREIGN PATENT DOCUMENTS

| | | |
|---|---|---|
| JP | H10-154900 A | 6/1998 |
| JP | 2016-045852 A | 4/2016 |

(Continued)

OTHER PUBLICATIONS

International Patent Application No. PCT/JP2020/035501; Int'l Search Report; dated Nov. 17, 2020; 4 pages.

*Primary Examiner* — Douglas A Hess
(74) *Attorney, Agent, or Firm* — BakerHostetler

(57) ABSTRACT

A conveyance abnormality prediction system includes an estimation unit that has a learned model having machine learned a relationship between a data set including sensor data outputted, at a time of substrate transport in the past, from each of a plurality of sensors provided on a substrate transport unit and a degree of conveyance abnormality at the time of the substrate transport, estimates a degree of conveyance abnormality at a time of new substrate transport by using, as an input, a data set including sensor data outputted from each of the plurality of sensors at the time of the new substrate transport, and outputs the estimated degree of conveyance abnormality.

25 Claims, 14 Drawing Sheets

(56) References Cited

U.S. PATENT DOCUMENTS

| | | | | |
|---|---|---|---|---|
| 7,490,010 B2* | 2/2009 | Osada | ............... | H01J 37/32935 |
| | | | | 700/121 |
| 8,060,330 B2* | 11/2011 | O'Neill | ............. | H01L 21/67259 |
| | | | | 702/90 |
| 8,135,485 B2* | 3/2012 | Chen | ..................... | H01L 21/681 |
| | | | | 700/121 |
| 8,225,683 B2* | 7/2012 | Bailey, III | ............. | G01B 21/20 |
| | | | | 73/104 |
| 9,442,482 B2* | 9/2016 | Miner | ............... | H01L 21/67259 |
| 10,714,364 B2* | 7/2020 | Hu | .................... | H01L 21/67733 |
| 10,802,475 B2* | 10/2020 | Francis | ................. | H01L 21/681 |
| 11,328,947 B1* | 5/2022 | Tan | ....................... | H01L 21/681 |
| 2014/0324208 A1 | 10/2014 | Miner et al. | | |
| 2019/0086912 A1 | 3/2019 | Hsu | | |
| 2020/0150159 A1 | 5/2020 | Takeda et al. | | |

FOREIGN PATENT DOCUMENTS

| | | |
|---|---|---|
| JP | 2017-157652 A | 9/2017 |
| JP | 6325325 B2 | 5/2018 |
| TW | 201915727 A | 4/2019 |
| WO | WO 2018/041378 A1 | 3/2018 |
| WO | WO 2018/230645 A1 | 12/2018 |

\* cited by examiner

FIG.13
ACTUAL SENSOR DATA OF FIRST TO n-TH CYCLES
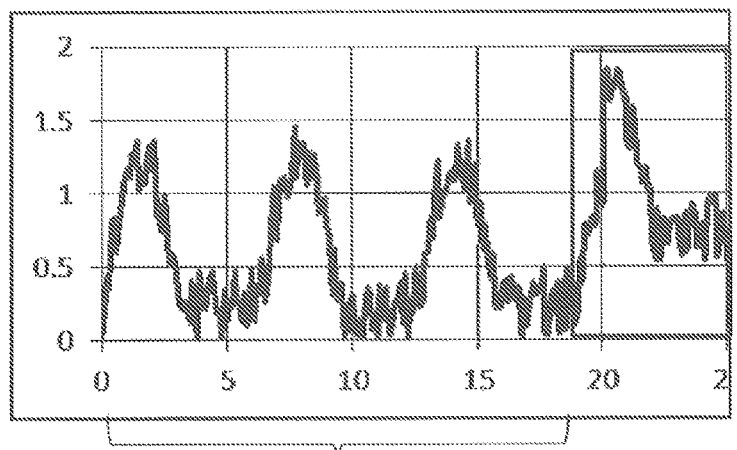
CALCULATE DEVIATION
ACTUAL SENSOR DATA OF FIRST TO n-1 TH CYCLES
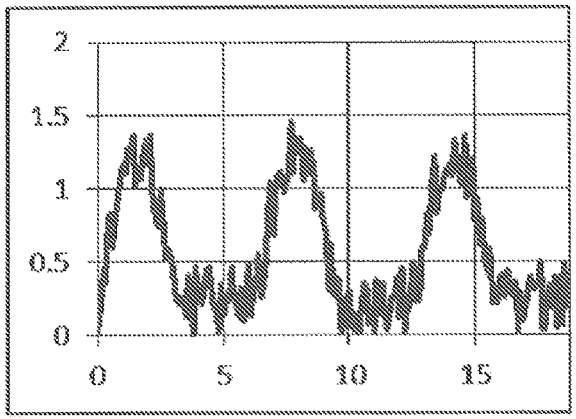 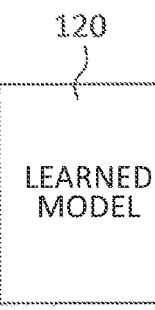 
PREDICTED VALUE OF SENSOR DATA OF n-TH CYCLE
LEARNED MODEL

CONVEYANCE ABNORMALITY PREDICTION SYSTEM

TECHNICAL FIELD

The present disclosure relates to a conveyance abnormality prediction system.

BACKGROUND ART

In a semiconductor manufacturing apparatus, it is essential to handle substrates. However, when the apparatus is operated for a long time, a handling error sometimes occurs due to wear of components or deviation in equipment. When a handling error occurs, there is a possibility that the apparatus stops and productivity is lowered or a substrate itself gets damaged.

Japanese Patent No. 6325325 proposes a system that operates as follows: an output of a sensor during operation of a wafer handling machine is compared with an output of the sensor stored at the time of position adjustment before operation of the wafer handling machine, and when the difference between the outputs exceeds a certain threshold value, it is determined that the wafer handling machine is deviated from the adjusted state.

SUMMARY OF INVENTION

However, in the system disclosed in Japanese Patent No. 6325325, detection of abnormality is performed by the following simple method: when the difference between an output of a sensor during operation of the wafer handling machine and an output of the sensor stored at a time of position adjustment before operation exceeds a certain threshold value, it is determined that abnormality is occurring. The detection probability is therefore not high.

It is desired to provide a conveyance abnormality prediction system capable of improving a detection probability of a conveyance abnormality.

A conveyance abnormality prediction system according to an aspect of the present disclosure includes an estimation unit that has a learned model having machine learned a relationship between a data set including sensor data outputted, at a time of substrate transport in the past, from each of a plurality of sensors provided on a substrate transport unit and a degree of conveyance abnormality at the time of the substrate transport, estimates a degree of conveyance abnormality at a time of new substrate transport by using, as an input, a data set including sensor data outputted from each of the plurality of sensors at the time of the new substrate transport, and outputs the estimated degree of conveyance abnormality.

BRIEF DESCRIPTION OF DRAWINGS

FIG. 13 is a schematic diagram for describing a configuration of a learned model in an eighth aspect.

DESCRIPTION OF EMBODIMENTS

Figure 1:
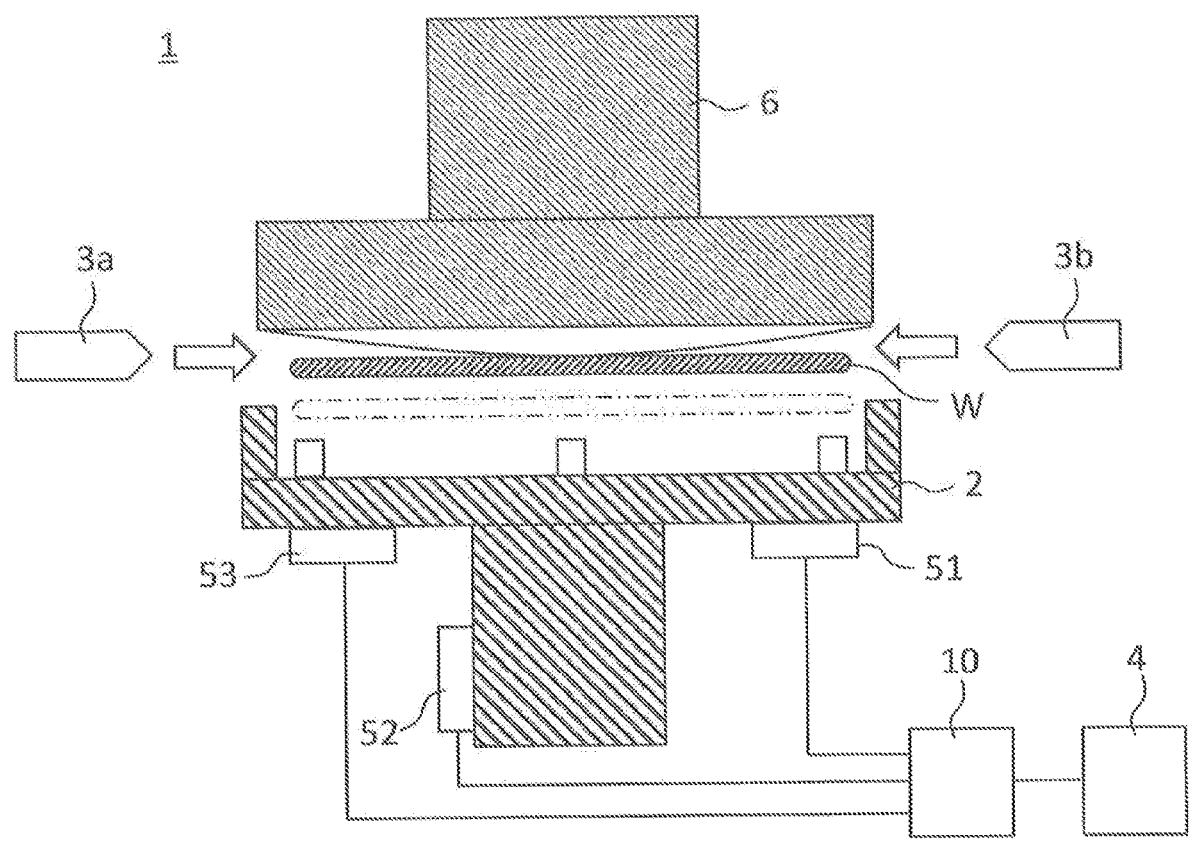
FIG. 1 is a diagram illustrating a schematic configuration of a substrate processing apparatus according to an embodiment.

A conveyance abnormality prediction system according to a first aspect of the embodiment includes an estimation unit that has a learned model having machine learned a relationship between a data set including sensor data outputted, at a time of substrate transport in the past, from each of a plurality of sensors provided on a substrate transport unit and a degree of conveyance abnormality at the time of the substrate transport, estimates a degree of conveyance abnormality at a time of new substrate transport by using, as an input, a data set including sensor data outputted from each of the plurality of sensors at the time of the new substrate transport, and outputs the estimated degree of conveyance abnormality.

With such an aspect, by using a learned model having machine learned a relationship between a data set including sensor data at a time of substrate transport in the past and a degree of conveyance abnormality at the time of the substrate transport, the estimation unit can estimate, with respect to a data set including sensor data at a time of new substrate transport, a degree of conveyance abnormality at the time of the new substrate transport, by totally considering a plurality of index data, and can output the estimated degree of conveyance abnormality. As a result, the detection probability of conveyance abnormality can be improved as compared with the conventional aspect in which when the difference between the output of a sensor during a substrate transport and the output of the sensor stored at the time of position adjustment before transport of a substrate exceeds a certain threshold value, it is determined that abnormality occurs. In addition, by using the learned model, it is possible to use, as the sensor data, vibration, sound, image data, and the like of equipment, which are difficult to handle in the conventional aspect.

A conveyance abnormality prediction system according to a second aspect of the embodiment is a conveyance abnormality prediction system according to the first aspect, wherein the plurality of sensors includes one or more than one of a vibration sensor, a sound sensor, an image sensor, a video sensor, a temperature sensor, an equipment movement speed sensor, an equipment operation torque sensor, and an equipment parallelism sensor.

A conveyance abnormality prediction system according to a third aspect of the embodiment is the conveyance abnormality prediction system according to the first or second aspect and further includes an output signal transmission unit that compares the degree of conveyance abnormality outputted by the estimation unit with a predetermined threshold value and transmits an output signal for outputting a maintenance notification and/or alarm to the output device when the degree of conveyance abnormality exceeds the predetermined threshold value.

A conveyance abnormality prediction system according to a fourth aspect of the embodiment is the conveyance abnormality prediction system according to any one of the first to third aspects, wherein the estimation unit estimates a degree of conveyance abnormality at a time of new substrate transport by using, as an input, a data set including sensor data from a start of transport to a present point of time at the time of the new substrate transport, and the estimation unit outputs the estimated degree of conveyance abnormality.

A conveyance abnormality prediction system according to a fifth aspect of the embodiment is the conveyance abnormality prediction system according to any one of the first to third aspects, wherein the estimation unit estimates a degree of conveyance abnormality at a time of new substrate transport by using, as an input, a data set including sensor data from a start of transport to an end of transport at the time of the new substrate transport, and the estimation unit outputs the estimated degree of conveyance abnormality.

A conveyance abnormality prediction system according to a sixth aspect of the embodiment is the conveyance abnormality prediction system according to any one of the first to third aspects, wherein the estimation unit estimates a degree of conveyance abnormality at a time of new substrate transport of a plurality of substrates by using, as an input, a data set including sensor data from a start of transport of a first substrate of the plurality of substrates to an end of transport of a last substrate of the plurality of substrates at the time of the new substrate transport of the plurality of substrates, and the estimation unit outputs the estimated degree of conveyance abnormality.

A conveyance abnormality prediction system according to a seventh aspect of the embodiment is the conveyance abnormality prediction system according to any one of the first to sixth aspects, and further includes a relearning unit that causes the learned model to relearn by using, as teacher data, the data set including the sensor data outputted at the time of the new substrate transport.

A conveyance abnormality prediction system according to an eighth aspect of the embodiment is the conveyance abnormality prediction system according to any one of the first to seventh aspects, wherein the data set further includes time information of at least one of an equipment operation time, an elapsed time after maintenance, and a component use time of a substrate handling unit at the time of the substrate transport.

A conveyance abnormality prediction system according to a ninth aspect of the embodiment is the conveyance abnormality prediction system according to any one of the first to eighth aspects, wherein the learned model is generated by machine learning of teacher data in which a remaining time or a remaining number of times of transport from the time of the substrate transport to an occurrence time of conveyance abnormality is associated to a data set including sensor data at a time of substrate transport in the past, the estimation unit estimates the degree of conveyance abnormality by using as an input a data set including sensor data at a time of new substrate transport, based on the remaining time or the remaining number of times of transport predicted by the learned model, and the estimation unit outputs the estimated degree of conveyance abnormality.

A conveyance abnormality prediction system according to a tenth aspect of the embodiment is the conveyance abnormality prediction system according to any one of the first to eighth aspects, wherein the learned model is generated by machine learning using a k-nearest neighbor algorithm while using, as teacher data, a data set including sensor data at a time of normal substrate transport in the past, the estimation unit estimates the degree of conveyance abnormality by using, as an input, a data set including sensor data at a time of new substrate transport and based on a distance to a k-nearest neighbor calculated by the learned model, and the estimation unit outputs the estimated degree of conveyance abnormality.

A conveyance abnormality prediction system according to an eleventh aspect of the embodiment is the conveyance abnormality prediction system according to any one of the first to eighth aspects.

The learned model is generated by machine learning by long short-term memory (LSTM) using, as teacher data, a data set including sensor data at a time of normal substrate transport in the past. The estimation unit calculates, by using as an input a data set including actual sensor data until a time of new substrate transport, a deviation between a data set including sensor data, at the time of the new substrate transport, predicted by the learned model from the data set including actual sensor data immediately before the time of the new substrate transport and a data set including actual sensor data at the time of the new substrate transport. The estimation unit estimates the degree of conveyance abnormality, based on the deviation, and outputs the estimated degree of conveyance abnormality.

A conveyance abnormality prediction system according to a twelfth aspect of the embodiment is the conveyance abnormality prediction system according to any one of the first to eighth aspects.

The learned model is generated by machine learning of teacher data in which a data set including sensor data at a time of substrate transport in the past is labeled with whether the time of the substrate transport is an occurrence time of conveyance abnormality or not. The estimation unit estimates the degree of conveyance abnormality by using, as an input, a data set including sensor data at a time of new substrate transport, based on a probability that is predicted by the learned model and indicates a probability that the time of the new substrate transport is an occurrence time of conveyance abnormality, and the estimation unit outputs the estimated degree of conveyance abnormality.

A conveyance abnormality prediction system according to a thirteenth aspect of the embodiment is the conveyance abnormality prediction system according to the twelfth aspect.

The learned model is generated by machine learning of teacher data in which a data set including sensor data at a time of substrate transport in the past is labeled with whether the time of the substrate transport is an occurrence time of conveyance abnormality or not and is labeled with a cause of conveyance abnormality when the time of the substrate transport is an occurrence time of conveyance abnormality. The estimation unit estimates the degree of conveyance abnormality for each cause of conveyance abnormality by using, as an input, a data set including sensor data at a time of new substrate transport, based on a probability that is predicted by the learned model for each cause of conveyance abnormality and indicates a probability that the time of the new substrate transport is an occurrence time of conveyance abnormality, and the estimation unit outputs the estimated degree of conveyance abnormality.

A conveyance abnormality prediction system according to a fourteenth aspect of the embodiment is the conveyance abnormality prediction system according to any one of the first to thirteenth aspects, wherein the estimation unit has a plurality of the learned models, estimates the degree of conveyance abnormality, based on a combination of predictions by the plurality of learned models, and outputs the estimated degree of conveyance abnormality.

A substrate processing apparatus according to a fifteenth aspect of the embodiment includes:

a substrate transport unit; and the conveyance abnormality prediction system according to any one of the first to fourteenth aspects.

A conveyance abnormality prediction method according to a sixteenth aspect of the embodiment is a conveyance abnormality prediction method executed by a computer, and the method includes:

estimating, by using a learned model having machine learned a relationship between a data set including sensor data outputted, at a time of substrate transport in the past, from each of a plurality of sensors provided on a substrate transport unit and a degree of conveyance abnormality at the time of the substrate transport, a degree of conveyance abnormality at a time of new substrate transport by using, as an input, a data set including sensor data outputted from each of the plurality of sensors at the time of the new substrate transport, and then outputting the estimated degree of conveyance abnormality.

A conveyance abnormality prediction program according to a seventeenth aspect of the embodiment is a conveyance abnormality prediction program for causing a computer to execute:

estimating, by using a learned model having machine learned a relationship between a data set including sensor data outputted, at a time of substrate transport in the past, from each of a plurality of sensors provided on a substrate transport unit and a degree of conveyance abnormality at the time of the substrate transport, a degree of conveyance abnormality at a time of new substrate transport by using, as an input, a data set including sensor data outputted from each of the plurality of sensors at the time of the new substrate transport, and then outputting the estimated degree of conveyance abnormality.

A non-transitory computer-readable recording medium according to an eighteenth aspect of the embodiment stores a conveyance abnormality prediction program for causing a computer to execute:

estimating, by using a learned model having machine learned a relationship between a data set including sensor data outputted, at a time of substrate transport in the past, from each of a plurality of sensors provided on a substrate transport unit and a degree of conveyance abnormality at the time of the substrate transport, a degree of conveyance abnormality at a time of new substrate transport by using, as an input, a data set including sensor data outputted from each of the plurality of sensors at the time of the new substrate transport, and then outputting the estimated degree of conveyance abnormality.

A learned model according to a nineteenth aspect of the embodiment is a tuned neural network system and has:

an input layer; one or more than one intermediate layer connected to the input layer; and an output layer connected to the intermediate layers, wherein the learned model is generated by machine learning of a relationship between a data set including sensor data outputted at a time of substrate transport in the past and a degree of conveyance abnormality at the time of the substrate transport, by repeating a process of inputting to the input layer the data set including sensor data outputted, at the time of the substrate transport in the past, from each of a plurality of sensors provided on a substrate transport unit, comparing an output result outputted, due to the inputting, from the output layer with the degree of conveyance abnormality at the time of the substrate transport, and updating a parameter of each node depending on an error of the comparison, where the process is repeated with respect to a data set including sensor data at a plurality of the times of substrate transport in the past, and the learned model causes a computer to function such that, when a data set including sensor data outputted from each of the plurality of sensors at a time of new substrate transport is inputted to the input layer, a degree of conveyance abnormality at the time of the new substrate transport is estimated and the estimated degree of conveyance abnormality is outputted from the output layer.

Hereinafter, specific examples of the embodiment will be described in detail with reference to the accompanying drawings. In the following description and the drawings used in the following description, the same reference signs are used for parts that can be configured to be identical, and redundant descriptions are omitted.

FIG. 1 is a diagram illustrating a schematic configuration of a substrate processing apparatus 1 according to an embodiment.

As illustrated in FIG. 1, the substrate processing apparatus 1 has a top ring 6, a substrate transport unit 2, nozzles 3a and 3b, a conveyance abnormality prediction system 10, and an output device 4.

The top ring 6 is provided with an airbag on a lower surface thereof, and is configured to hold a substrate W facing downward and to move the substrate W between a substrate transport position (a position facing the substrate transport unit 2) and a substrate processing position (for example, a position facing a not-shown polishing table).

The nozzles 3a and 3b are disposed on lateral sides of the top ring 6 at the substrate transport position, and are configured to inject air and shower between the airbag of the top ring 6 and the substrate W to peel the substrate W off from the top ring 6.

The substrate transport unit 2 is disposed below the top ring 6 at the substrate transport position, and is configured to receive the substrate W peeled off and falling down from the top ring 6. As the substrate transport unit 2, a lifter or a linear transporter (LTP) is used, for example.

As illustrated in FIG. 1, the substrate transport unit 2 is provided with a plurality of (three in the illustrated example) sensors 51 to 53. In the illustrated example, each of the plurality of sensors 51 to 53 is a vibration sensor (acceleration sensor) that measures vibration of the substrate transport unit 2, and is attached to a place such as an arm portion or a shaft portion of the substrate transport unit 2, to which vibration generated at a time of transfer of the substrate W is directly transmitted.

Note that the plurality of sensors 51 to 53 are not limited to vibration sensors and may be configured with one or more than one type of a vibration sensor, a sound sensor, an image sensor, a video sensor, a temperature sensor, an equipment movement speed sensor, an equipment operation torque sensor, and an equipment parallelism sensor.

Figure 3:
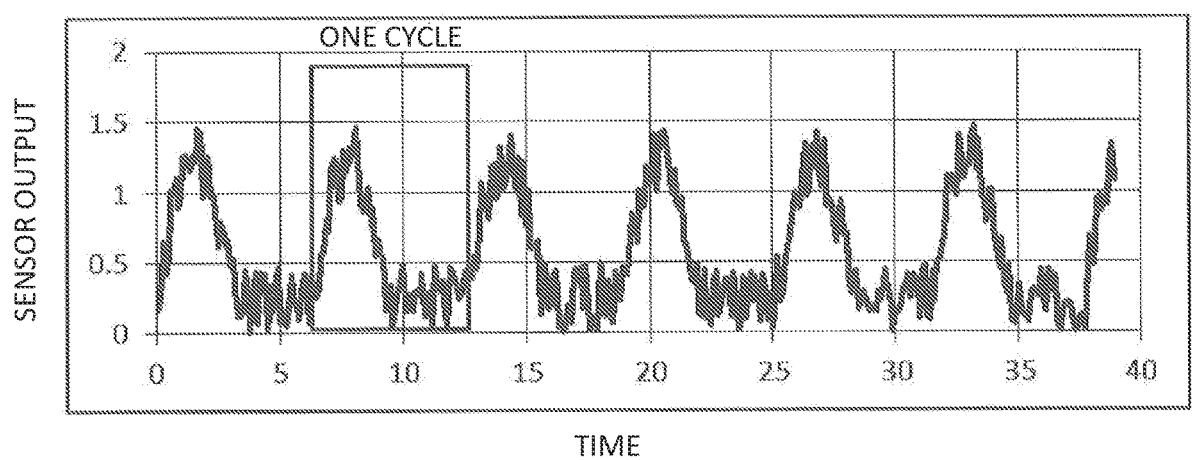
FIG. 3 is a diagram illustrating an example of sensor data at a time of normal substrate transport.

FIG. 3 is a diagram illustrating an example of sensor data outputted from the sensors 51 to 53 at a time of normal substrate transport. In FIG. 3, a region surrounded by a solid line square represents sensor data from a start of transport to an end of transport at a time of transporting one substrate (one cycle). As illustrated in FIG. 3, in a case of normal transport, sensor data having a similar waveform is repeatedly outputted every cycle from the sensors 51 to 53.

Figure 4:
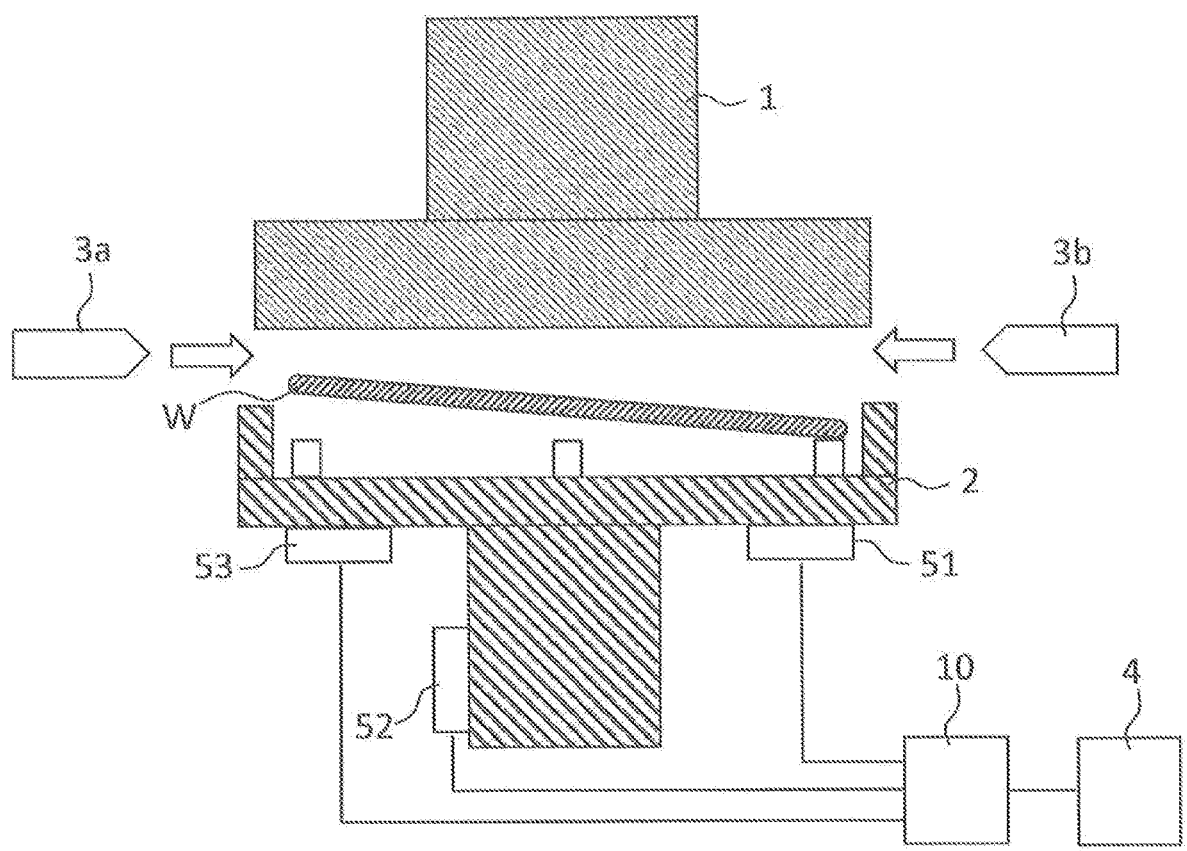
FIG. 4 is a diagram for describing a substrate transport unit at an occurrence time of conveyance abnormality.
Figure 5:
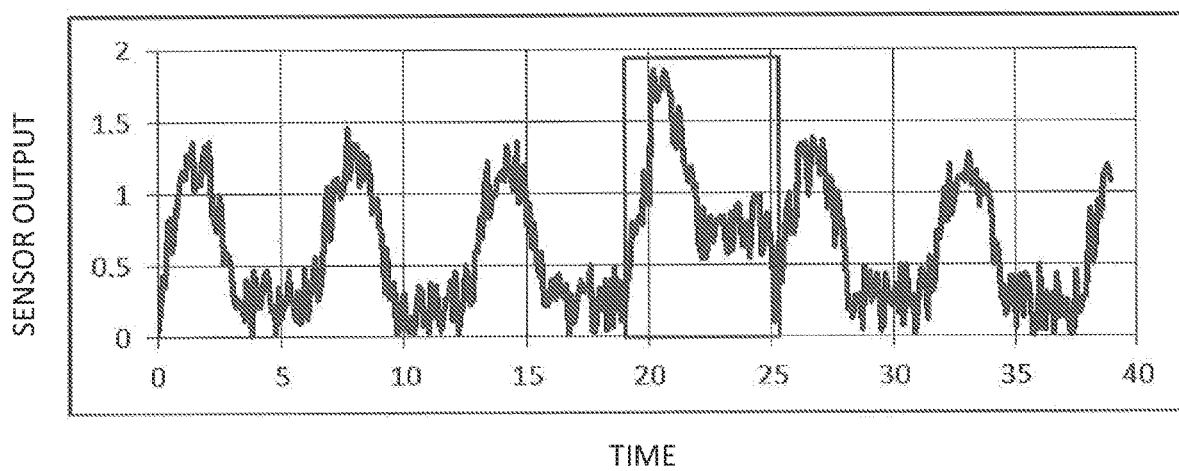
FIG. 5 is a diagram illustrating an example of sensor data at an occurrence time of conveyance abnormality.

FIG. 4 is a diagram for describing the substrate transport unit 2 when a conveyance abnormality occurs, and FIG. 5 is a diagram illustrating an example of sensor data at an occurrence time of conveyance abnormality.

As illustrated in FIG. 4, it is one typical symptom of conveyance abnormality that the substrate W is not laterally symmetrically peeled off from the top ring 6, and the substrate W falls in an obliquely inclined posture. In this case, an impact when the substrate W is seated on the substrate transport unit 2 concentrates on one part of the substrate W, so that the substrate W is easily damaged. When the symptom gets worse, the substrate W falls off from the substrate transport unit 2. In the example illustrated in FIG. 4, as causes of the conveyance abnormality (abnormality types), the following two causes are considered: (1) the air and shower injected from the nozzles 3a and 3b hit deviated positions; and (2) an axis of the top ring 6 and an axis of the substrate transport unit 2 are out of alignment.

As illustrated in FIG. 5, when a conveyance abnormality occurs, the sensors 51 to 53 output sensor data having a waveform different from the waveform at a normal time. In FIG. 5, an area surrounded by a solid line square indicates sensor data from a start of transport to an end of transport when a conveyance abnormality occurs.

The output device 4 is an interface that outputs various types of information to a user (for example, an operator of the substrate processing apparatus 1), and, for example, a video display unit (display) such as a liquid crystal display, a lamp, a speaker, or the like is used.

As illustrated in FIG. 1, the conveyance abnormality prediction system 10 is communicably connected to each of the plurality of sensors 51 to 53 and the output device 4.

Figure 2:
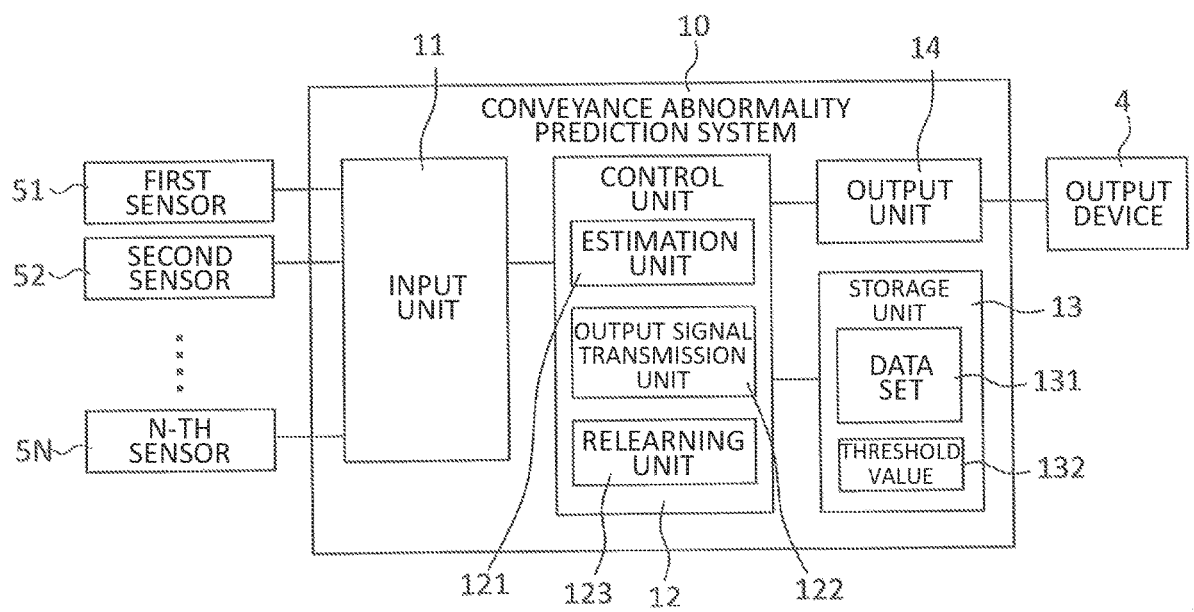
FIG. 2 is a block diagram illustrating a configuration of a conveyance abnormality prediction system according to an embodiment.

Next, a configuration of the conveyance abnormality prediction system 10 will be described. FIG. 2 is a block diagram illustrating the configuration of the conveyance abnormality prediction system 10. At least a part of the conveyance abnormality prediction system 10 is configured with one computer or quantum computing system, or a plurality of computers or quantum computing systems connected to each other via a network.

As illustrated in FIG. 2, the conveyance abnormality prediction system 10 has an input unit 11, a control unit 12, a storage unit 13, and an output unit 14. The units 11 to 14 are communicably connected to each other via a bus or a network.

Of the units 11 to 14, the input unit 11 is a communication interface to the plurality of sensors 51 to 5N provided on the substrate transport unit 2. The input unit 11 may be connected to an output terminal of each of the plurality of sensors 51 to 5N by wire or radio.

The output unit 14 is a communication interface to the output device 4. The output unit 14 may be connected to an input terminal of the output device 4 by wire or radio.

The storage unit 13 is a non-volatile data storage such as a flash memory. The storage unit 13 stores various data handled by the control unit 12. For example, the storage unit 13 stores a data set 151 referred to by an estimation unit 121 to be described later and a threshold value 152 referred to by an output signal transmission unit 122 to be described later.

The data set 151 includes sensor data that is outputted from each of the plurality of sensors 51 to 5N provided on the substrate transport unit 2 at a time of new substrate transport and is acquired via the input unit 11. The data set 151 may further include time information of at least one of an equipment operation time, an elapsed time after maintenance, and a component use time of the substrate handling unit (a part that comes in contact with a substrate W and is gradually worn) at the time of the substrate transport.

As illustrated in FIG. 2, the control unit 12 has the estimation unit 121, the output signal transmission unit 122, and a relearning unit 123. These units may be implemented by a processor, in the conveyance abnormality prediction system 10, executing a predetermined program, or may be implemented by hardware.

The estimation unit 121 has a learned model 120 (for example, a tuned neural network system, see FIGS. 6 to 13) having machine learned a relationship between a data set including sensor data outputted, at a time of substrate transport in the past, from each of the plurality of sensors 51 to 5N provided on the substrate transport unit 2 and a degree of conveyance abnormality at the time of the substrate transport. The estimation unit 121 estimates a degree of conveyance abnormality at a time of new substrate transport by using, as an input, a data set (that is, the data set 131 stored in the storage unit 13) including sensor data outputted from each of the plurality of sensors 51 to 5N at the time of the new substrate transport, and outputs the estimated degree of conveyance abnormality.

In a first example of a processing timing in the estimation unit 121, the estimation unit 121 may perform processing in real time, and specifically, the estimation unit 121 may estimate a degree of conveyance abnormality at a time of new substrate transport by using, as an input, the data set 131 including the sensor data from a start of transport to a present point of time at the time of the new substrate transport, and output the estimated degree of conveyance abnormality.

In a second example of the processing timing in the estimation unit 121, the estimation unit 121 may perform processing for each substrate W, and specifically, the estimation unit 121 may estimate a degree of conveyance abnormality at a time of new substrate transport by using, as an input, the data set 131 including the sensor data from a start of transport to an end of transport at the time of the new substrate transport and output the estimated degree of conveyance abnormality.

In a third example of the processing timing in the estimation unit 121, the estimation unit 121 may perform processing for each lot (for example, one lot including 25 sheets) of substrates W, and specifically, the estimation unit 121 may estimate a degree of conveyance abnormality at a time of new substrate transport of the plurality (one lot) of new substrates by using, as an input, the data set 131 including the sensor data from a start of transport of a first substrate to an end of transport of a last substrate at the time of the new substrate transport of the plurality (one lot) of new substrates.

The estimation unit 121 may use, as an input, the sensor data outputted from each of the plurality of sensors 51 to 5N as is, or may use, as an input, data obtained by extracting (preprocessing) intensity in a predetermined frequency region by fast Fourier transform (FFT).

Figure 6:
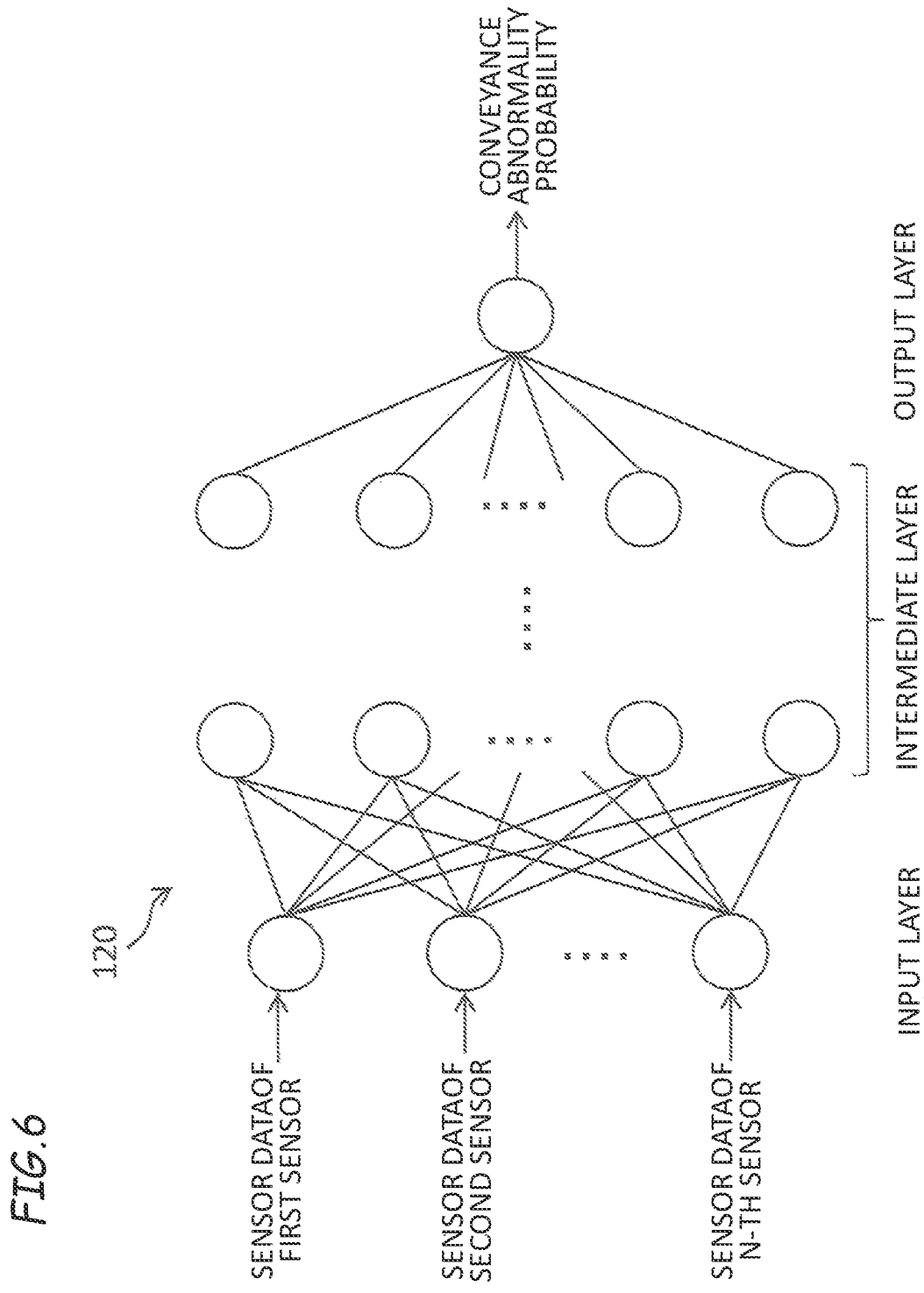
FIG. 6 is a schematic diagram for describing a configuration of a learned model in a first aspect.

FIG. 6 is a schematic diagram for describing a configuration of the learned model 120 in the first aspect. In the example illustrated in FIG. 6, the learned model 120 is a tuned neural network system, and includes: a hierarchical neural network or quantum neural network (QNN) having an input layer; one or more than one intermediate layer connected to the input layer; and an output layer connected to the intermediate layers. FIG. 6 illustrates a feed forward neural network as a hierarchical neural network, but it is possible to use various types of neural networks such as a convolutional neural network (CNN) and a recurrent neural network (RNN). The learned model 120 may include a neural network in which an intermediate layer is multilayered into two or more layers, in other words, deep learning.

An example of a method for generating the learned model 120 of the first aspect is described as follows: teacher data is prepared in which sensor data outputted, at a time of substrate transport in the past, from each of the plurality of sensors 51 to 5N provided on the substrate transport unit 2 is labeled with whether the time of the substrate transport is an occurrence time of conveyance abnormality or not (for example, 0: a time of normal substrate transport, 1: an occurrence time of conveyance abnormality); the sensor data at a time of one substrate transport included in the teacher data is inputted to the input layer as illustrated in FIG. 6, and an output result consequently outputted from the output layer is compared with the label, included in the teacher data, indicating whether the time of the substrate transport is an occurrence time of conveyance abnormality or not; and a process of updating parameters (weight, threshold value, and the like) of each node depending on the error of the comparison is repeated for each piece of the data, at the plurality of times of substrate transport, included in the teacher data. As a result, the learned model 120 (tuned neural network system) is generated in which, on the basis of the sensor data outputted, at a time of substrate transport in the past, from each of the plurality of sensors 51 to 5N provided on the substrate transport unit 2, a probability that the time of the substrate transport is an occurrence time of conveyance abnormality (conveyance abnormality probability) is predicted.

In the first aspect, the estimation unit 121 estimates the degree of conveyance abnormality at a time of new substrate transport by using, as an input, the sensor data outputted from each of the plurality of sensors 51 to 5N at the time of the new substrate transport and on the basis of the probability that is predicted by the learned model 120 and indicates a probability that the time of the new substrate transport is an occurrence time of conveyance abnormality (conveyance abnormality probability), and the estimation unit 121 outputs the estimated degree of conveyance abnormality. Note that the degree of conveyance abnormality may be a probability (conveyance abnormality probability) itself predicted by the learned model 120 and indicating a probability that the time of the new substrate transport is an occurrence time of conveyance abnormality, or may be a value obtained by uniquely converting the conveyance abnormality probability by a predetermined function.

Figure 7:
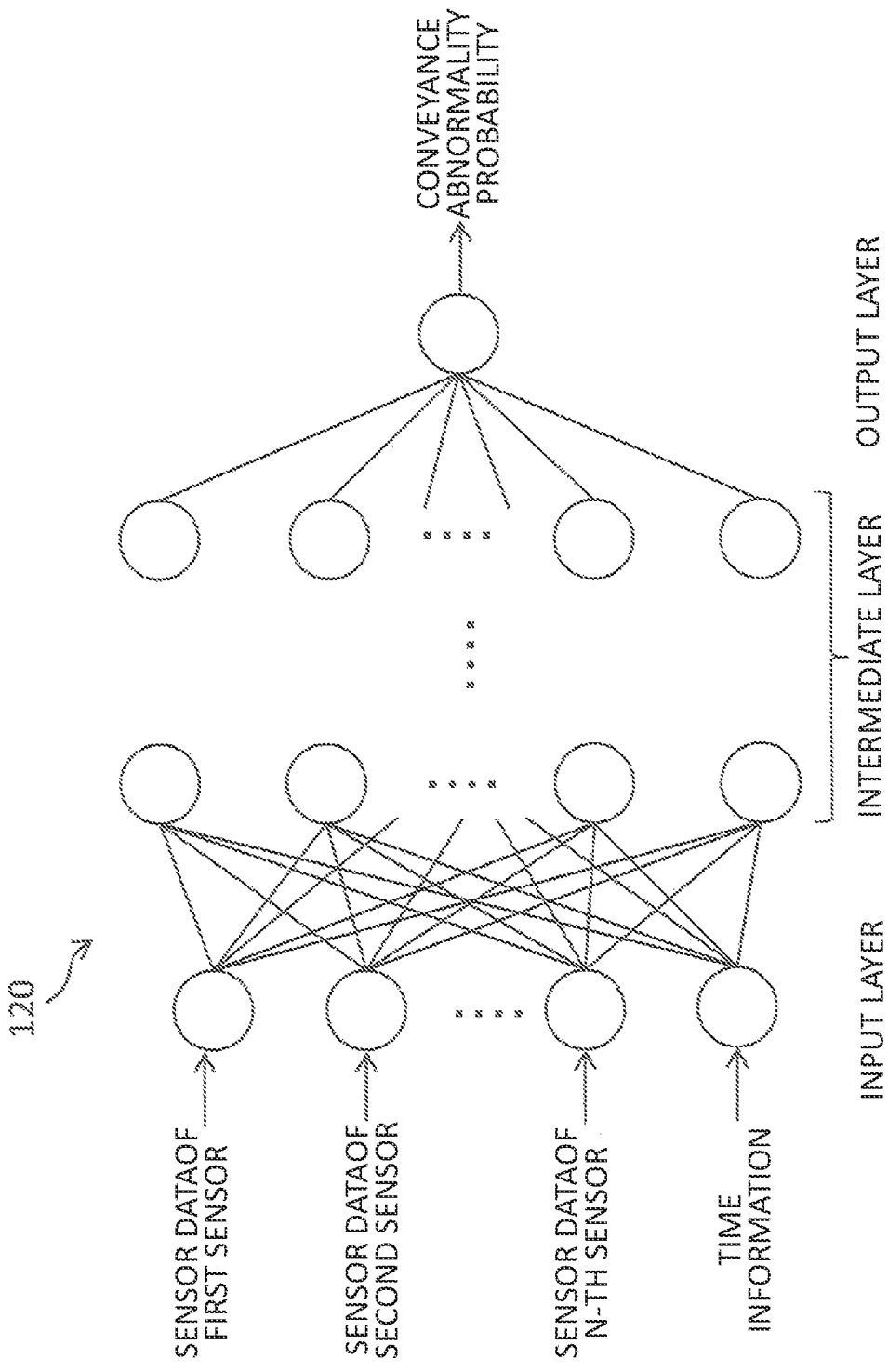
FIG. 7 is a schematic diagram for describing a configuration of a learned model in a second aspect.

FIG. 7 is a schematic diagram for describing a configuration of a learned model 120 in the second aspect. In the example illustrated in FIG. 7, the learned model 120 is a tuned neural network system, and includes: a hierarchical neural network or quantum neural network (QNN) having an input layer; one or more than one intermediate layer connected to the input layer; and an output layer connected to the intermediate layers. FIG. 7 illustrates a feed forward neural network as a hierarchical neural network, but it is possible to use various types of neural networks such as a convolutional neural network (CNN) and a recurrent neural network (RNN). The learned model 120 may include a neural network in which an intermediate layer is multilayered into two or more layers, in other words, deep learning.

An example of a method for generating the learned model 120 of the second aspect is described as follows: teacher data is prepared in which a data set including sensor data outputted, at a time of substrate transport in the past, from each of the plurality of sensors 51 to 5N provided on the substrate transport unit 2 and time information (specifically, at least one of an equipment operation time, an elapsed time after maintenance, and a component use time of the substrate handling unit at the time of the substrate transport) at the time of the substrate transport is labeled with whether the time of the substrate transport is an occurrence time of conveyance abnormality or not (for example, 0: a time of normal substrate transport, 1: an occurrence time of conveyance abnormality); as illustrated in FIG. 7, the data set at a time of one substrate transport included in the teacher data is inputted to the input layer, and an output result consequently outputted from the output layer is compared with the label, included in the teacher data, indicating whether the time of the substrate transport is an occurrence time of conveyance abnormality or not; and a process of updating parameters (weight, threshold value, and the like) of each node depending on the error of the comparison is repeated for each piece of the data, at the plurality of times of substrate transport, included in the teacher data. As a result, the learned model 120 (tuned neural network system) is generated in which, on the basis of the data set including the sensor data outputted, at a time of substrate transport in the past, from each of the plurality of sensors 51 to 5N provided on the substrate transport unit 2 and the time information at the time of the substrate transport, a probability that the time of the substrate transport is an occurrence time of conveyance abnormality (conveyance abnormality probability) is predicted.

In the second aspect, the estimation unit 121 estimates the degree of conveyance abnormality at a time of new substrate transport by using, as an input, the data set including the sensor data outputted from each of the plurality of sensors 51 to 5N at the time of the new substrate transport and the time information at the time of the new substrate transport and on the basis of the probability predicted by the learned model 120 and indicating a probability that the time of the new substrate transport is an occurrence time of conveyance abnormality (conveyance abnormality probability), and the estimation unit 121 outputs the estimated degree of conveyance abnormality. Note that the degree of conveyance abnormality may be a probability (conveyance abnormality probability) itself predicted by the learned model 120 and indicating a probability that the time of the new substrate transport is an occurrence time of conveyance abnormality, or may be a value obtained by uniquely converting the conveyance abnormality probability by a predetermined function.

Figure 8:
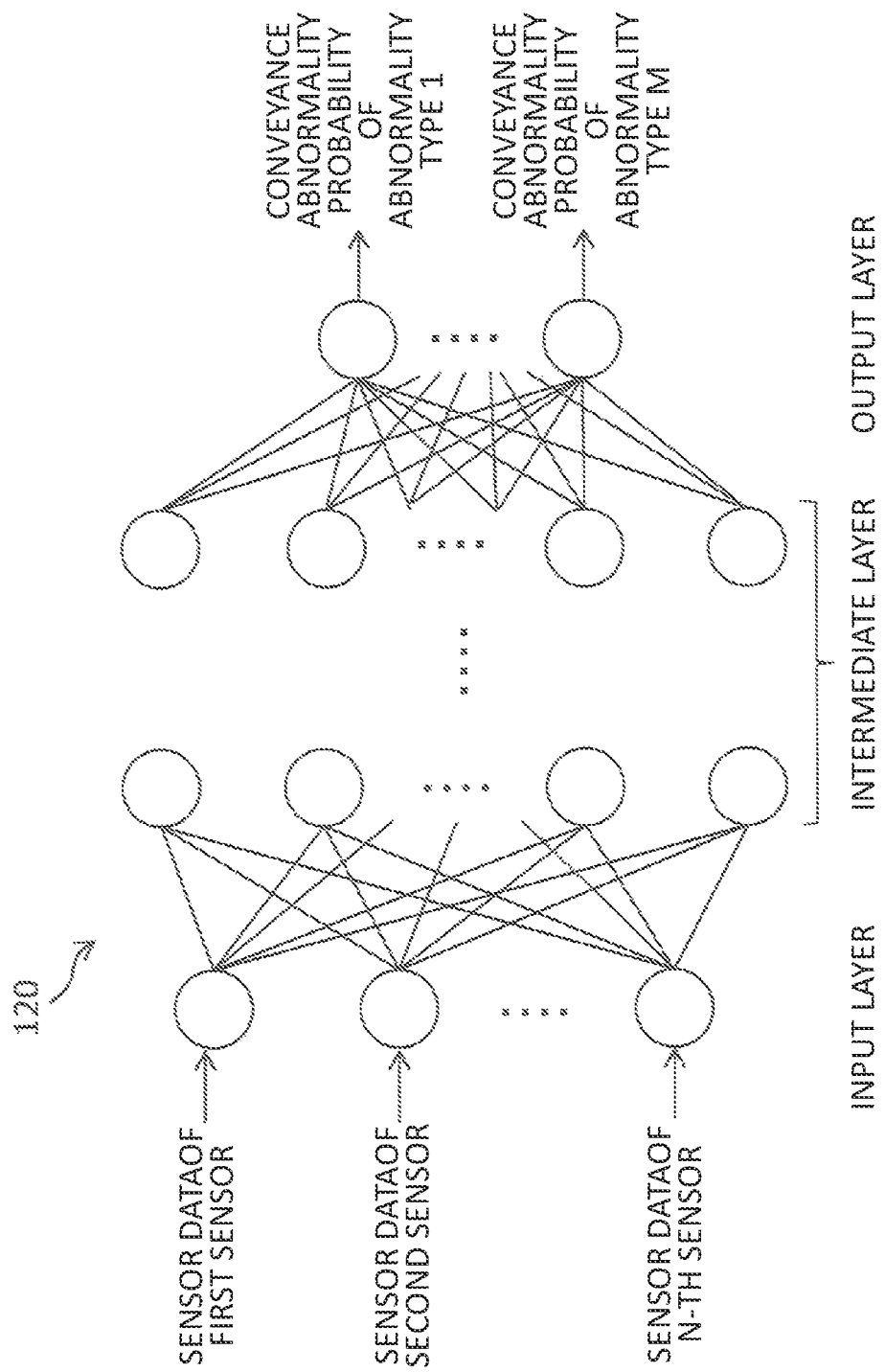
FIG. 8 is a schematic diagram for describing a configuration of a learned model in a third aspect.

FIG. 8 is a schematic diagram for describing a configuration of a learned model 120 in the third aspect. In the example illustrated in FIG. 8, the learned model 120 is a tuned neural network system, and includes: a hierarchical neural network or quantum neural network (QNN) having an input layer; one or more than one intermediate layer connected to the input layer; and an output layer connected to the intermediate layers. FIG. 8 illustrates a feed forward neural network as a hierarchical neural network, but it is possible to use various types of neural networks such as a convolutional neural network (CNN) and a recurrent neural network (RNN). The learned model 120 may include a neural network in which an intermediate layer is multilayered into two or more layers, in other words, deep learning.

An example of a method for generating the learned model 120 of the third aspect is described as follows: teacher data is prepared in which sensor data outputted, at a time of substrate transport in the past, from each of the plurality of sensors 51 to 5N provided on the substrate transport unit 2 is labeled with whether the time of the substrate transport is an occurrence time of conveyance abnormality or not (for example, 0: a time of normal substrate transport, 1: an occurrence time of conveyance abnormality), and the teacher data is labeled with a cause of conveyance abnormality (abnormality type) when the time of the substrate transport is an occurrence time of conveyance abnormality; as illustrated in FIG. 8, the sensor data at a time of one substrate transport included in the teacher data is inputted to the input layer, and an output result consequently outputted from the output layer is compared with the label for each cause of conveyance abnormality (abnormality type), included in the teacher data, indicating whether the time of the substrate transport is an occurrence time of conveyance abnormality or not; and a process of updating parameters (weight, threshold value, and the like) of each node depending on the error of the comparison is repeated for each piece of the data, at the plurality of times of substrate transport, included in the teacher data. As a result, the learned model 120 (tuned neural network system) is generated in which on the basis of the sensor data outputted, at a time of substrate transport in the past, from each of the plurality of sensors 51 to 5N provided on the substrate transport unit 2, a probability that the time of the substrate transport is an occurrence time of conveyance abnormality (conveyance abnormality probability) is predicted for each of the cause of conveyance abnormality (abnormality type).

In the third aspect, the estimation unit 121 estimates, for each cause of conveyance abnormality (abnormality type), the degree of conveyance abnormality at a time of new substrate transport by using, as an input, the sensor data outputted from each of the plurality of sensors 51 to 5N at the time of the new substrate transport and on the basis of the probability that is predicted for each cause of conveyance abnormality (abnormality type) and indicates a probability that the time of the new substrate transport is an occurrence time of conveyance abnormality (conveyance abnormality probability) by the learned model 120, and the estimation unit 121 outputs the estimated degree of conveyance abnormality. Note that the degree of conveyance abnormality may be a probability (conveyance abnormality probability) itself predicted by the learned model 120 and indicating a probability that the time of the new substrate transport is an occurrence time of conveyance abnormality, or may be a value obtained by uniquely converting the conveyance abnormality probability by a predetermined function.

Figure 9:
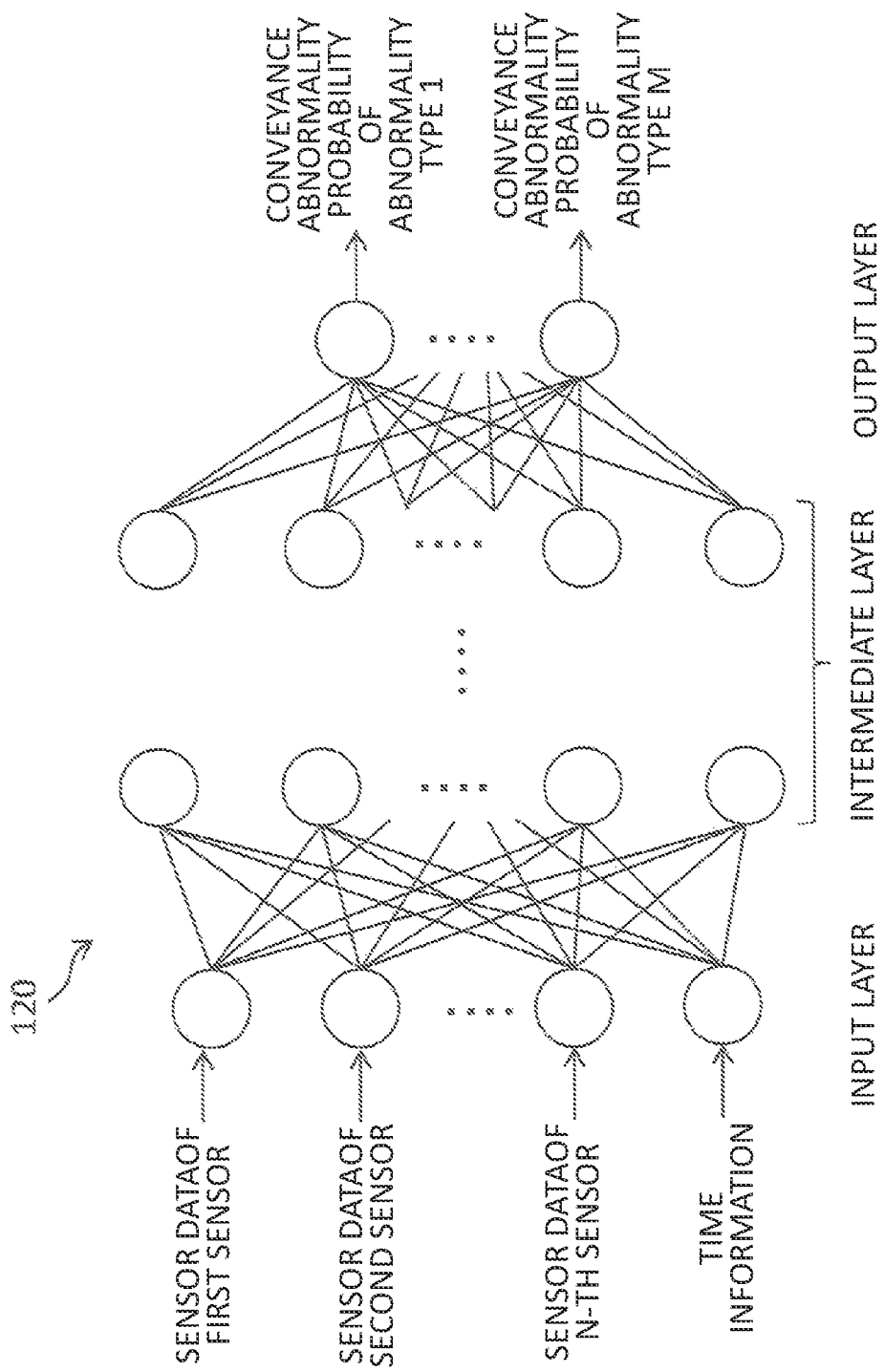
FIG. 9 is a schematic diagram for describing a configuration of a learned model in a fourth aspect.

FIG. 9 is a schematic diagram for describing a configuration of a learned model 120 in the fourth aspect. In the example illustrated in FIG. 9, the learned model 120 is a tuned neural network system, and includes: a hierarchical neural network or quantum neural network (QNN) having an input layer; one or more than one intermediate layer connected to the input layer; and an output layer connected to the intermediate layers. FIG. 9 illustrates a feed forward neural network as a hierarchical neural network, but it is possible to use various types of neural networks such as a convolutional neural network (CNN) and a recurrent neural network (RNN). The learned model 120 may include a neural network in which an intermediate layer is multilayered into two or more layers, in other words, deep learning.

An example of a method for generating the learned model 120 of the fourth aspect is described as follows: teacher data is prepared in which a data set including sensor data outputted, at a time of substrate transport in the past, from each of the plurality of sensors 51 to 5N provided on the substrate transport unit 2 and time information (specifically, at least one of an equipment operation time, an elapsed time after maintenance, and a component use time of the substrate handling unit at the time of the substrate transport) at the time of the substrate transport is labeled whether the time of the substrate transport is an occurrence time of conveyance abnormality or not (for example, 0: a time of normal substrate transport, 1: an occurrence time of conveyance abnormality), and the teacher data is labeled with a cause of conveyance abnormality (abnormality type) when the time of the substrate transport is an occurrence time of conveyance abnormality; as illustrated in FIG. 9, the data set at a time of one substrate transport included in the teacher data is inputted to the input layer, and an output result consequently outputted from the output layer is compared with the label for each cause of conveyance abnormality (abnormality type), included in the teacher data, indicating whether the time of the substrate transport is an occurrence time of conveyance abnormality or not; and a process of updating parameters (weight, threshold value, and the like) of each node depending on the error of the comparison is repeated for each piece of the data, at the plurality of times of substrate transport, included in the teacher data. As a result, the learned model 120 (tuned neural network system) is generated in which, on the basis of the data set including the sensor data outputted, at a time of substrate transport in the past, from each of the plurality of sensors 51 to 5N provided on the substrate transport unit 2 and the time information at the time of the substrate transport, a probability that the time of the substrate transport is an occurrence time of conveyance abnormality (conveyance abnormality probability) is predicted for each cause of conveyance abnormality (abnormality type).

In the fourth aspect, the estimation unit 121 estimates, for each cause of conveyance abnormality (abnormality type), the degree of conveyance abnormality at a time of new substrate transport by using, as an input, the data set including the sensor data outputted from each of the plurality of sensors 51 to 5N at the time of the new substrate transport and the time information at the time of the new substrate transport, and on the basis of the probability that the time of the new substrate transport is an occurrence time of conveyance abnormality (conveyance abnormality probability) predicted for each cause of conveyance abnormality (abnormality type) by the learned model 120, and outputs the estimated degree of conveyance abnormality. Note that the degree of conveyance abnormality may be a probability (conveyance abnormality probability) itself predicted by the learned model 120 and indicating a probability that the time of the new substrate transport is an occurrence time of conveyance abnormality, or may be a value obtained by uniquely converting the conveyance abnormality probability by a predetermined function.

Figure 10:
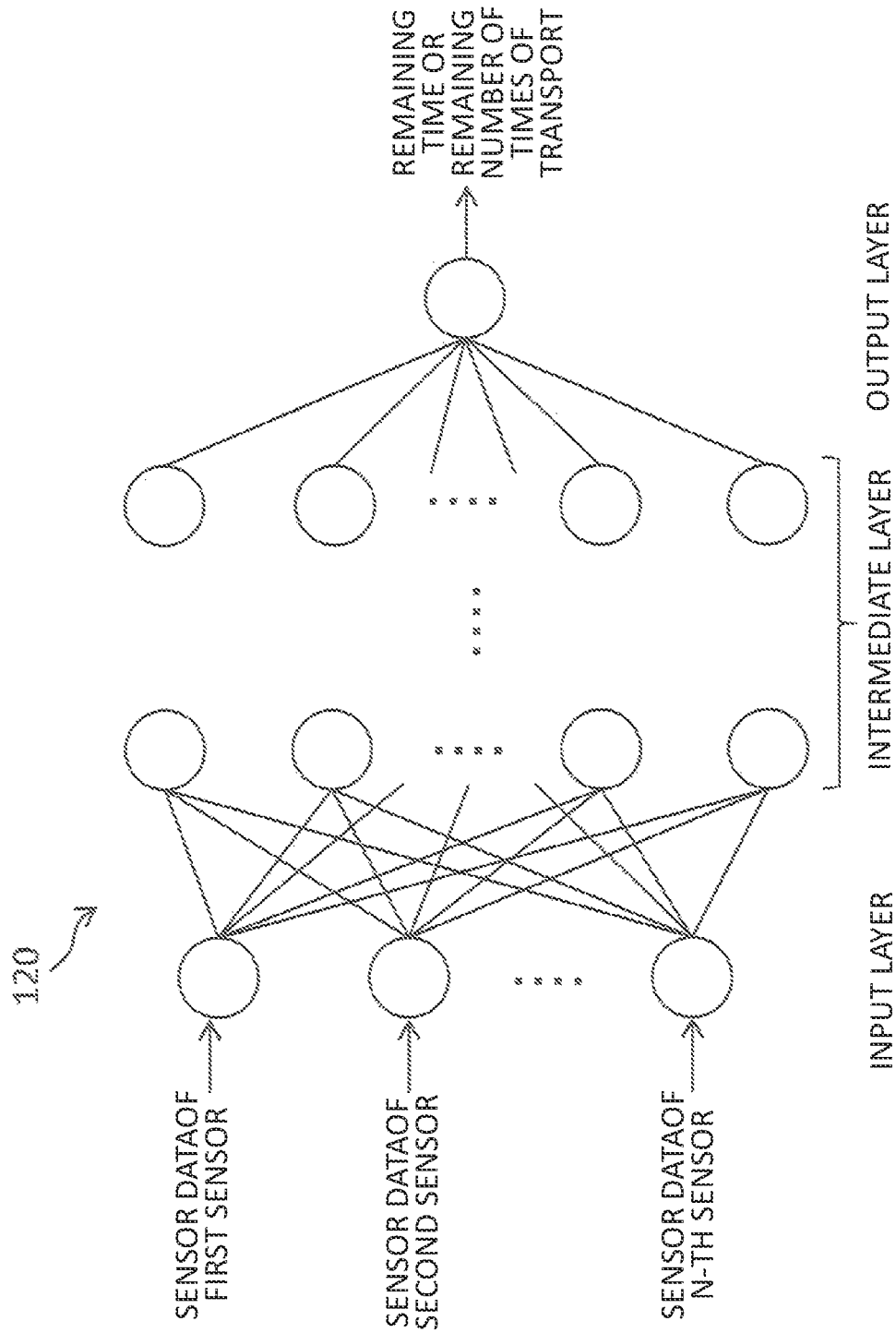
FIG. 10 is a schematic diagram for describing a configuration of a learned model in a fifth aspect.

FIG. 10 is a schematic diagram for describing a configuration of a learned model 120 in the fifth aspect. In the example illustrated in FIG. 10, the learned model 120 is a tuned neural network system, and includes: a hierarchical neural network or quantum neural network (QNN) having an input layer; one or more than one intermediate layer connected to the input layer; and an output layer connected to the intermediate layers. FIG. 10 illustrates a feed forward neural network as a hierarchical neural network, but it is possible to use various types of neural networks such as a convolutional neural network (CNN) and a recurrent neural network (RNN). The learned model 120 may include a neural network in which an intermediate layer is multilayered into two or more layers, in other words, deep learning.

An example of a method for generating the learned model 120 of the fifth aspect is described as follows: teacher data is prepared in which a remaining time or a remaining number of times of transport from the time of the substrate transport to an occurrence time of conveyance abnormality is associated to sensor data outputted, at a time of substrate transport in the past, from each of the plurality of sensors 51 to 5N provided on the substrate transport unit 2; as illustrated in FIG. 10, the sensor data at a time of one substrate transport included in the teacher data is inputted to the input layer, and an output result consequently outputted from the output layer is compared with the remaining time or the remaining number of times of transport from the time of the substrate transport to the occurrence time of conveyance abnormality; and a process of updating parameters (weight, threshold value, and the like) of each node depending on the error of the comparison is repeated for each piece of the data, at the plurality of times of substrate transport, included in the teacher data. As a result, the learned model 120 (tuned neural network system) is generated in which a remaining time or a remaining number of times of transport from a time of substrate transport to an occurrence time of conveyance abnormality is predicted on the basis of the sensor data outputted, at the time of the substrate transport in the past, from each of the plurality of sensors 51 to 5N provided on the substrate transport unit 2.

In the fifth aspect, the estimation unit 121 estimates the degree of conveyance abnormality at a time of new substrate transport by using, as an input, the sensor data outputted from each of the plurality of sensors 51 to 5N at the time of the new substrate transport and on the basis of a remaining time or a remaining number of times of transport predicted by the learned model 120, and outputs the estimated degree of conveyance abnormality. Note that the degree of conveyance abnormality may be the remaining time or the remaining number of times of transport predicted by the learned model 120 predicted by the learned model 120 as is, or may be a value obtained by uniquely converting the remaining time or the remaining number of times of transport predicted by the learned model 120 by a predetermined function. For example, the degree of conveyance abnormality may be a value obtained by dividing the remaining time predicted by the learned model 120 by an average time from a time of maintenance to an occurrence time of conveyance abnormality, or may be a value obtained by dividing the remaining number of times of transport predicted by the learned model 120 by an average number of times of transport from a time of maintenance to an occurrence time of conveyance abnormality.

Figure 11:
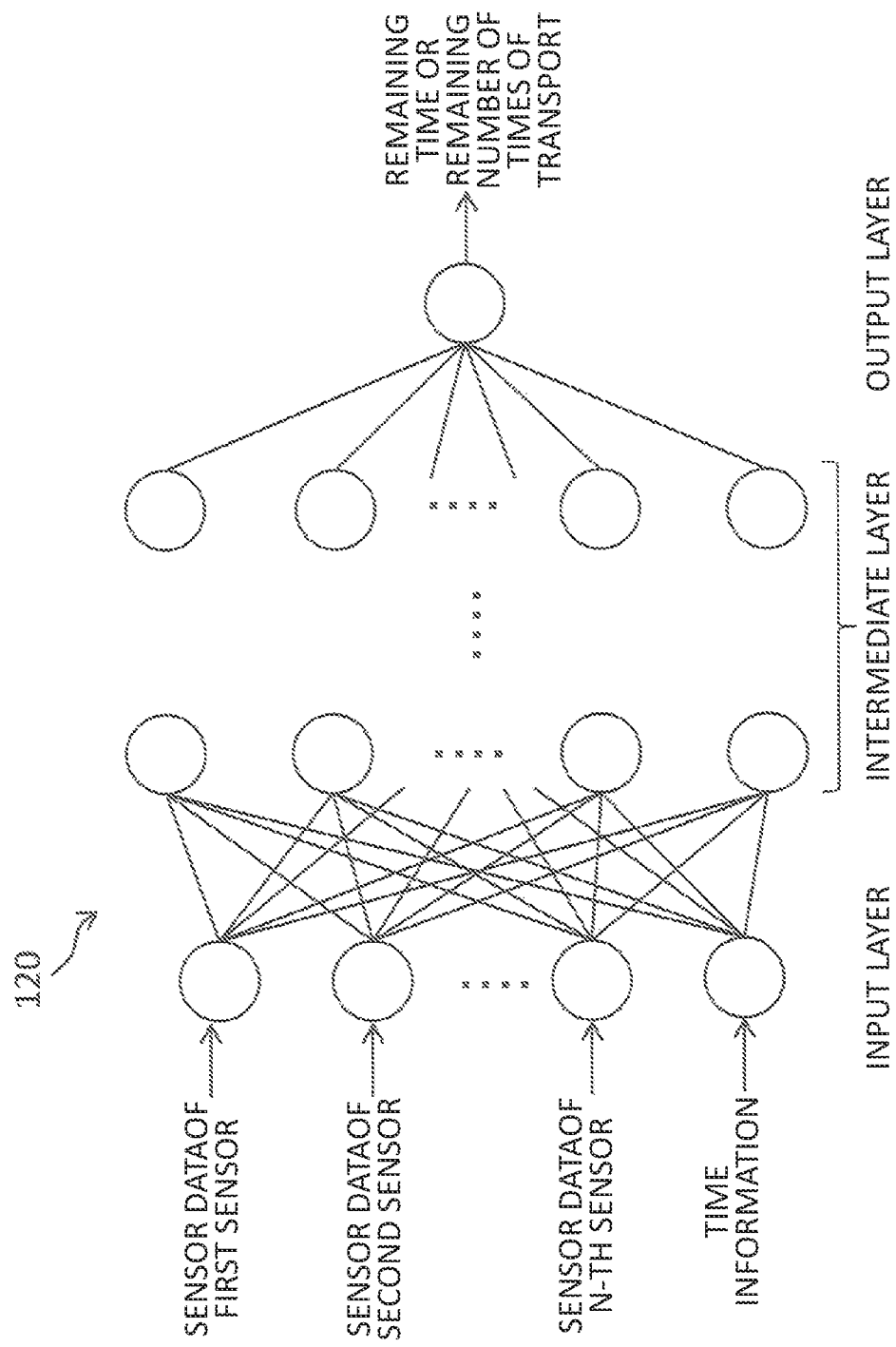
FIG. 11 is a schematic diagram for describing a configuration of a learned model in a sixth aspect.

FIG. 11 is a schematic diagram for describing a configuration of a learned model 120 in the sixth aspect. In the example illustrated in FIG. 11, the learned model 120 is a tuned neural network system, and includes: a hierarchical neural network or quantum neural network (QNN) having an input layer; one or more than one intermediate layer connected to the input layer; and an output layer connected to the intermediate layers. FIG. 11 illustrates a feed forward neural network as a hierarchical neural network, but it is possible to use various types of neural networks such as a convolutional neural network (CNN) and a recurrent neural network (RNN). The learned model 120 may include a neural network in which an intermediate layer is multilayered into two or more layers, in other words, deep learning.

An example of a method for generating the learned model 120 of the sixth aspect is described as follows: teacher data is prepared in which a remaining time or a remaining number of times of transport from the time of substrate transport in the past to an occurrence time of conveyance abnormality is associated to a data set including sensor data outputted, at a time of substrate transport in the past, from each of the plurality of sensors 51 to 5N provided on the substrate transport unit 2 and time information (specifically, at least one of an equipment operation time, an elapsed time after maintenance, and a component use time of the substrate handling unit, at the time of the substrate transport) at the time of the substrate transport; as illustrated in FIG. 10, the data set at a time of one substrate transport included in the teacher data is inputted to the input layer, and an output result consequently outputted from the output layer is compared with the remaining time or the remaining number of times of transport from the time of the substrate transport to the occurrence time of conveyance abnormality; and a process of updating parameters (weight, threshold value, and the like) of each node depending on the error of the comparison is repeated for each piece of the data, at the plurality of times of substrate transport, included in the teacher data. As a result, the learned model 120 (tuned neural network system) is generated in which a remaining time or a remaining number of times of transport from a time of substrate transport to an occurrence time of conveyance abnormality is predicted on the basis of the data set including the sensor data outputted, at the time of the substrate transport in the past, from each of the plurality of sensors 51 to 5N provided on the substrate transport unit 2 and the time information at the time of the substrate transport.

In the sixth aspect, the estimation unit 121 estimates the degree of conveyance abnormality at a time of new substrate transport by using, as an input, the data set including the sensor data outputted, at the time of the new substrate transport, from each of the plurality of sensors 51 to 5N and the time information at the time of the new substrate transport, on the basis of a remaining time or a remaining number of times of transport predicted by the learned model 120, and outputs the estimated degree of conveyance abnormality. Note that the degree of conveyance abnormality may be the remaining time or the remaining number of times of transport predicted by the learned model 120 predicted by the learned model 120 as is, or may be a value obtained by uniquely converting the remaining time or the remaining number of times of transport predicted by the learned model 120 by a predetermined function. For example, the degree of conveyance abnormality may be a value obtained by dividing the remaining time predicted by the learned model 120 by an average time from a time of maintenance to an occurrence time of conveyance abnormality, or may be a value obtained by dividing the remaining number of times of transport predicted by the learned model 120 by an average number of times of transport from a time of maintenance to an occurrence time of conveyance abnormality.

Figure 12:
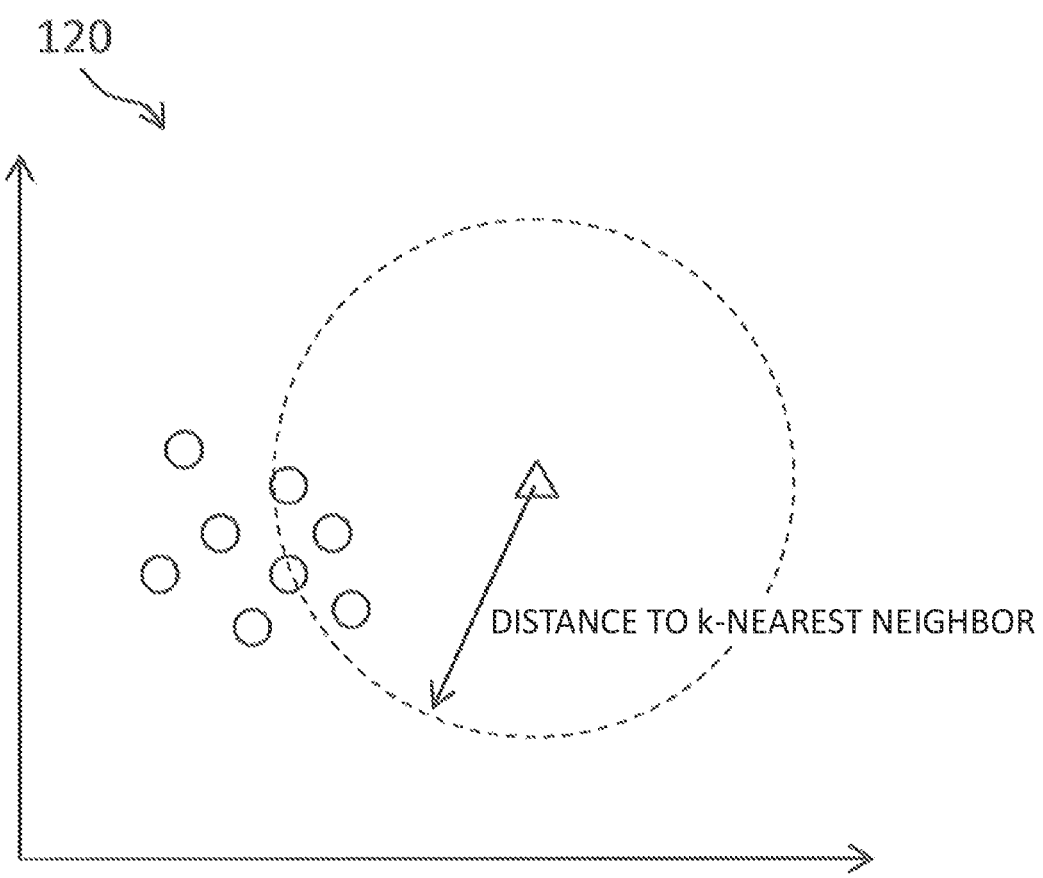
FIG. 12 is a schematic diagram for describing a configuration of a learned model in a seventh aspect.

FIG. 12 is a schematic diagram for describing a configuration of a learned model 120 in the seventh aspect. In the example illustrated in FIG. 12, the learned model 120 is generated by machine learning by a k-nearest neighbor algorithm, using, as teacher data, data set including sensor data at a time of normal substrate transport in the past, and the estimation unit calculates a distance to a k-nearest neighbor of the data set, on the basis of a data set including sensor data at a time of new substrate transport. In the example illustrated in FIG. 12, each of a plurality of white circles ("○") indicates a position of sensor data in a feature space at the time of past normal substrate transport, a white triangle ("Δ") indicates a position of sensor data in the feature space at the time of new substrate transport, and a broken line represents a distance to the k-nearest neighbor when k=3.

In the seventh aspect, the estimation unit 121 estimates the degree of conveyance abnormality by using, as an input, a data set including sensor data at a time of new substrate transport on the basis of the distance to the k-nearest neighbor calculated by the learned model 121, and outputs the estimated degree of conveyance abnormality. Note that the degree of conveyance abnormality may be the distance to the k-nearest neighbor calculated by the learned model 120 as is, or may be a value obtained by uniquely converting the distance to the k-nearest neighbor by a predetermined function.

FIG. 13 is a schematic diagram for describing a configuration of a learned model 120 in the eighth aspect. In the example illustrated in FIG. 13, the learned model 120 is a tuned neural network system, and includes: a hierarchical neural network or quantum neural network (QNN) having an input layer; one or more than one intermediate layer connected to the input layer; and an output layer connected to the intermediate layers. The learned model 120 may include a neural network in which an intermediate layer is multi-layered into two or more layers, in other words, deep learning.

The learned model 120 in the eighth aspect is generated by machine learning by long short-term memory (LSTM), using, as teacher data, a data set including sensor data at a time of normal substrate transport in the past. In the example illustrated in FIG. 13, on the basis of, for example, a data set including actual sensor data from a time of maintenance to immediately before a time of new substrate transport (sensor data of the first to n-1 th cycles), the learned model 120 predicts a data set including sensor data at the time of the new substrate transport (predicted value of sensor data of the n-th cycle).

In the eighth aspect, by using as an input a data set including actual sensor data from a time of maintenance until a time of new substrate transport (sensor data of the first to n-th cycles), the estimation unit 121 calculates a deviation between a data set including sensor data, at the time of the new substrate transport (predicted value of the sensor data of the n-th cycle), predicted by the learned model 120 from the data set including the actual sensor data until immediately before the time of the new substrate transport (sensor data of the first to n-1 th cycles) and a data set including actual sensor data at the time of the new substrate transport (sensor data of the n-th cycle). The estimation unit 121 estimates a degree of conveyance abnormality, based on the deviation, and outputs the estimated degree of conveyance abnormality. Note that the degree of conveyance abnormality may be the deviation as is or may be a value obtained by uniquely converting the deviation by a predetermined function.

The estimation unit 121 may have a plurality of learned models 120 (for example, two or more of the learned models 120 in the first to eighth aspects), and may estimate the degree of conveyance abnormality on the basis of a combination of predictions (that is, ensemble learning) by the plurality of learned models 120 and output the estimated degree of conveyance abnormality.

The output signal transmission unit 122 compares the degree of conveyance abnormality outputted by the estimation unit 121 with a predetermined threshold value 152 and transmits an output signal for outputting a maintenance notification and/or alarm to the output device 4 via the output unit 14 when the degree of conveyance abnormality exceeds the predetermined threshold value 152.

The relearning unit 123 causes the learned model 120 to relearn using, as teacher data, the data set 131 including the sensor data output at a time of new substrate transport.

Figure 14:
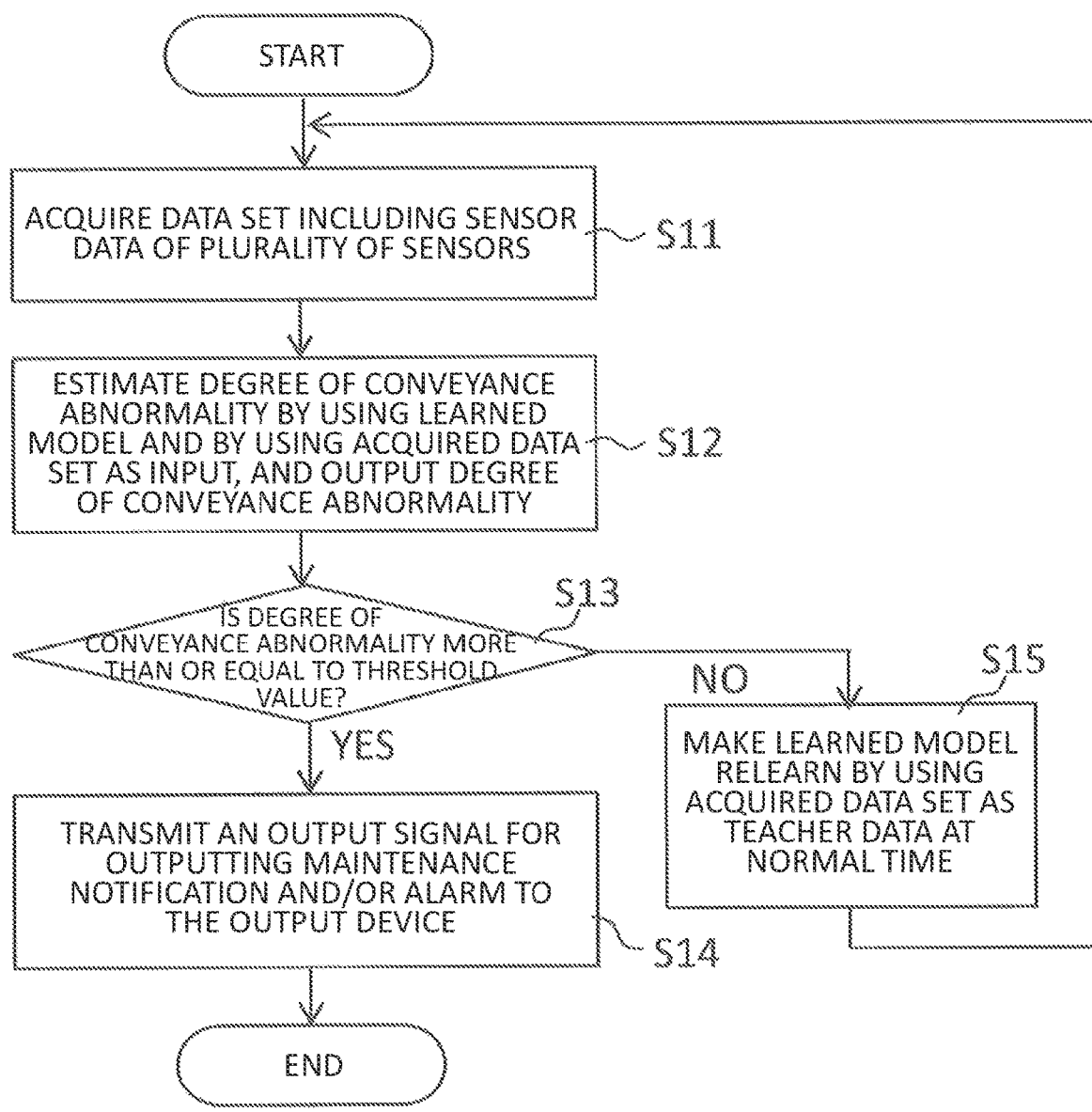
FIG. 14 is a flowchart for describing an example of a conveyance abnormality prediction method according to an embodiment.

Next, there will be described an example of a conveyance abnormality prediction method performed by the conveyance abnormality prediction system 10 having the above configuration. FIG. 14 is a flowchart illustrating an example of the conveyance abnormality prediction method.

As illustrated in FIG. 14, the estimation unit 121 acquires a data set 131 including sensor data outputted, at a time of new substrate transport, from each of the plurality of sensors 51 to 5N provided on the substrate transport unit 2 (step S11). The data set 131 acquired by the estimation unit 121 may include time information of at least one of an equipment operation time, an elapsed time after maintenance, and a component use time of the substrate handling unit at the time of the substrate transport 2. The data set 131 acquired by the estimation unit 121 is stored in the storage unit 13.

Then, by using the learned model 120 having machine learned a relationship between a data set including sensor data outputted from each of the plurality of sensors 51 to 5N at a time of substrate transport in the past and a degree of conveyance abnormality at the time of the substrate transport, the estimation unit 121 estimates a degree of conveyance abnormality at a time of new substrate transport by using, as an input, the data set 131 including sensor data outputted from each of the plurality of sensors 51 to 5N at the time of the new substrate transport, and the estimation unit 121 outputs the estimated degree of conveyance abnormality (step S12).

In step S12, the following operation may be performed. By using the learned model 120 (see FIGS. 8 and 9) having machine learned a relationship between a data set including sensor data outputted from each of the plurality of sensors 51 to 5N at a time of substrate transport in the past and a degree of conveyance abnormality for each cause of conveyance abnormality (abnormality type) at the time of the substrate transport, the estimation unit 121 estimates a degree of conveyance abnormality for each cause of conveyance abnormality (abnormality type) at a time of new substrate transport by using as an input the data set 131 including sensor data outputted from each of the plurality of sensors 51 to 5N at the time of the new substrate transport, and the estimation unit 121 outputs the estimated degree of conveyance abnormality.

Next, the output signal transmission unit 122 compares the degree of conveyance abnormality outputted by the estimation unit 121 with the predetermined threshold value 152 (step S13).

If the degree of conveyance abnormality outputted by the estimation unit 121 exceeds the predetermined threshold value 152 (step S13: YES), the output signal transmission unit 122 transmits an output signal for outputting a maintenance notification and/or alarm to the output device 4 via the output unit 14 (step S14).

On the other hand, if the degree of conveyance abnormality outputted by the estimation unit 121 does not exceed the threshold value 152 (step S13: NO), the relearning unit 123 causes the learned model 120 to relearn by using the data set 131 including the sensor data outputted at the time of the new substrate transport as the teacher data labeled that the substrate transport is normal (step S15).

With the present embodiment as described above, since the estimation unit 121 uses a learned model 120 having machine learned a relationship between a data set including sensor data at a time of substrate transport in the past and a degree of conveyance abnormality at the time of the substrate transport, the estimation unit 121 can estimate a degree of conveyance abnormality at a time of new substrate transport with respect to a data set 131 including sensor data at the time of the new substrate transport, by totally considering a plurality of index data, and the estimation unit 121 can output the estimated degree of conveyance abnormality. As a result, the detection probability of conveyance abnormality can be improved as compared with the conventional aspect in which when the difference between the output of a sensor during a substrate transport and the output of the sensor stored at the time of position adjustment before transport of a substrate exceeds a certain threshold value, it is determined that abnormality occurs. In addition, by using the learned model 120, it is possible to use, as the sensor data, vibration of equipment, sound, image data, and the like that are difficult to handle in the conventional mode.

In addition, with the present embodiment, when the degree of conveyance abnormality estimated by the estimation unit 121 exceeds the threshold value 152, the output signal transmission unit 122 transmits an output signal for outputting a maintenance notification and/or alarm to the output device 4. Therefore, a user (for example, an operator of the substrate processing apparatus 1) can perform maintenance with the output from the output device 4 as a trigger, and a handling error can be prevented in advance.

In addition, with the present embodiment, since the relearning unit 123 causes the learned model 120 to relearn by using as teacher data the data set 131 including the sensor data outputted at a time of new substrate transport, it is possible to obtain a system that follows a change in the operating state of the device.

In addition, with the embodiment illustrated in FIGS. 8 and 9, the estimation unit 121 estimates a degree of conveyance abnormality at a time of new substrate transport for each cause of conveyance abnormality (abnormality type) on the basis of a relationship between a data set including sensor data at a time of substrate transport in the past and a degree of conveyance abnormality for each cause of conveyance abnormality (abnormality type) at the time of the substrate transport and by using as an input a data set including sensor data at a the time of the new substrate transport. Therefore, the cause of conveyance abnormality (abnormality type) having a higher degree of conveyance abnormality can be checked preferentially, and it is therefore possible to shorten a maintenance time of the apparatus.

The conveyance abnormality prediction system 10 according to the present embodiment can be configured with one computer or quantum computing system, or a plurality of computers or quantum computing systems connected to each other via a network, and the protection targets of the present disclosure include the following: a program for causing one or a plurality of computers or quantum computing systems to implement the conveyance abnormality prediction system 10, and a non-transitory computer-readable recording medium storing the program.

Although the embodiment and the variations have been described above by way of examples, the scope of the present technology is not limited thereto, and can be changed and modified according to purposes without departing from the scope described in the claims. In addition, the embodiment and the variations can be appropriately combined with each other as long as contents of processes do not contradict each other.

The invention claimed is:

1. A conveyance abnormality prediction system comprising:
an estimation unit that has a learned model having machine learned a relationship between a data set including sensor data outputted, at a time of substrate transport in a past, from each of a plurality of sensors provided on a substrate transport unit and a degree of conveyance abnormality at the time of the substrate transport, estimates a degree of conveyance abnormality at a time of new substrate transport by using, as an input, a data set including sensor data outputted from each of the plurality of sensors at the time of the new substrate transport, and outputs the estimated degree of conveyance abnormality, wherein
the learned model is generated by machine learning by long short-term memory (LSTM) using, as teacher data, a data set including sensor data at a time of normal substrate transport in a past,
the estimation unit calculates, by using as an input a data set including actual sensor data until a time of new substrate transport, a deviation between a data set including sensor data, at the time of the new substrate transport, predicted by the learned model from the data set including actual sensor data immediately before the time of the new substrate transport and a data set including actual sensor data at the time of the new substrate transport, and
the estimation unit estimates the degree of conveyance abnormality, based on the deviation, and outputs the estimated degree of conveyance abnormality.

2. The conveyance abnormality prediction system according to claim 1, wherein the plurality of sensors includes one or more of a vibration sensor, a sound sensor, an image sensor, a video sensor, a temperature sensor, an equipment movement speed sensor, an equipment operation torque sensor, or an equipment parallelism sensor.

3. The conveyance abnormality prediction system according to claim 1, further comprising an output signal transmission unit that compares the degree of conveyance abnormality outputted by the estimation unit with a predetermined threshold value and transmits an output signal for outputting a maintenance notification and/or alarm to the output device when the degree of conveyance abnormality exceeds the predetermined threshold value.

4. The conveyance abnormality prediction system according to claim 1, wherein the estimation unit estimates a degree of conveyance abnormality at a time of new substrate transport by using, as an input, a data set including sensor data from a start of transport to a present point of time at the time of the new substrate transport, and
the estimation unit outputs the estimated degree of conveyance abnormality.

5. The conveyance abnormality prediction system according to claim 1, wherein the estimation unit estimates a degree of conveyance abnormality at a time of new substrate transport by using, as an input, a data set including sensor data from a start of transport to an end of transport at the time of the new substrate transport, and
the estimation unit outputs the estimated degree of conveyance abnormality.

6. The conveyance abnormality prediction system according to claim 1, wherein the estimation unit estimates a degree of conveyance abnormality at a time of new substrate transport of a plurality of substrates by using, as an input, a data set including sensor data from a start of transport of a first substrate of the plurality of substrates to an end of transport of a last substrate of the plurality of substrates at the time of the new substrate transport of the plurality of substrates, and the estimation unit outputs the estimated degree of conveyance abnormality.

7. The conveyance abnormality prediction system according to claim 1, further comprising a relearning unit that causes the learned model to relearn by using, as teacher data, the data set including the sensor data outputted at the time of the new substrate transport.

8. The conveyance abnormality prediction system according to claim 1, wherein the data set further includes time information of at least one of an equipment operation time, an elapsed time after maintenance, and a component use time of a substrate handling unit at the time of the substrate transport.

9. The conveyance abnormality prediction system according to claim 1, wherein the learned model is generated by machine learning of teacher data in which a remaining time or a remaining number of times of transport from the time of the substrate transport to an occurrence time of conveyance abnormality is associated to a data set including sensor data at a time of substrate transport in a past, the estimation unit estimates the degree of conveyance abnormality by using as an input a data set including sensor data at a time of new substrate transport, based on the remaining time or the remaining number of times of transport predicted by the learned model, and the estimation unit outputs the estimated degree of conveyance abnormality.

10. The conveyance abnormality prediction system according to claim 1, wherein the learned model is generated by machine learning using a k-nearest neighbor algorithm while using, as teacher data, a data set including sensor data at a time of normal substrate transport in a past, the estimation unit estimates the degree of conveyance abnormality by using, as an input, a data set including sensor data at a time of new substrate transport and based on a distance to a k-nearest neighbor calculated by the learned model, and the estimation unit outputs the estimated degree of conveyance abnormality.

11. The conveyance abnormality prediction system according to claim 1, wherein the estimation unit has a plurality of the learned models, estimates the degree of conveyance abnormality, based on a combination of predictions by the plurality of learned models, and outputs the estimated degree of conveyance abnormality.

12. A substrate processing apparatus comprising:
a substrate transport unit; and
the conveyance abnormality prediction system according to claim 1.

13. A conveyance abnormality prediction system comprising:
an estimation unit that has a learned model having machine learned a relationship between a data set including sensor data outputted, at a time of substrate transport in a past, from each of a plurality of sensors provided on a substrate transport unit and a degree of conveyance abnormality at the time of the substrate transport, estimates a degree of conveyance abnormality at a time of new substrate transport by using, as an input, a data set including sensor data outputted from each of the plurality of sensors at the time of the new substrate transport, and outputs the estimated degree of conveyance abnormality, wherein the learned model is generated by machine learning of teacher data in which a data set including sensor data at a time of substrate transport in a past is labeled with whether the time of the substrate transport is an occurrence time of conveyance abnormality or not, the estimation unit estimates the degree of conveyance abnormality by using, as an input, a data set including sensor data at a time of new substrate transport, based on a probability that is predicted by the learned model and indicates a probability that the time of the new substrate transport is an occurrence time of conveyance abnormality, and the estimation unit outputs the estimated degree of conveyance abnormality.

14. The conveyance abnormality prediction system according to claim 13, wherein the learned model is generated by machine learning of teacher data in which a data set including sensor data at a time of substrate transport in a past is labeled with whether the time of the substrate transport is an occurrence time of conveyance abnormality or not and is labeled with a cause of conveyance abnormality when the time of the substrate transport is an occurrence time of conveyance abnormality, the estimation unit estimates the degree of conveyance abnormality for each cause of conveyance abnormality by using, as an input, a data set including sensor data at a time of new substrate transport, based on a probability that is predicted by the learned model for each cause of conveyance abnormality and indicates a probability that the time of the new substrate transport is an occurrence time of conveyance abnormality, and the estimation unit outputs the estimated degree of conveyance abnormality.

15. The conveyance abnormality prediction system according to claim 13, wherein the plurality of sensors includes one or more of a vibration sensor, a sound sensor, an image sensor, a video sensor, a temperature sensor, an equipment movement speed sensor, an equipment operation torque sensor, or an equipment parallelism sensor.

16. The conveyance abnormality prediction system according to claim 13, further comprising an output signal transmission unit that compares the degree of conveyance abnormality outputted by the estimation unit with a predetermined threshold value and transmits an output signal for outputting a maintenance notification and/or alarm to the output device when the degree of conveyance abnormality exceeds the predetermined threshold value.

17. The conveyance abnormality prediction system according to claim 13, wherein the estimation unit estimates a degree of conveyance abnormality at a time of new substrate transport by using, as an input, a data set including sensor data from a start of transport to a present point of time at the time of the new substrate transport, and the estimation unit outputs the estimated degree of conveyance abnormality.

18. The conveyance abnormality prediction system according to claim 13, wherein the estimation unit estimates a degree of conveyance abnormality at a time of new substrate transport by using, as an input, a data set including sensor data from a start of transport to an end of transport at the time of the new substrate transport, and the estimation unit outputs the estimated degree of conveyance abnormality.

19. The conveyance abnormality prediction system according to claim 13, wherein the estimation unit estimates a degree of conveyance abnormality at a time of new substrate transport of a plurality of substrates by using, as an input, a data set including sensor data from a start of transport of a first substrate of the plurality of substrates to an end of transport of a last substrate of the plurality of substrates at the time of the new substrate transport of the plurality of substrates, and the estimation unit outputs the estimated degree of conveyance abnormality.

20. The conveyance abnormality prediction system according to claim 13, further comprising a relearning unit that causes the learned model to relearn by using, as teacher data, the data set including the sensor data outputted at the time of the new substrate transport.

21. The conveyance abnormality prediction system according to claim 13, wherein the data set further includes time information of at least one of an equipment operation time, an elapsed time after maintenance, and a component use time of a substrate handling unit at the time of the substrate transport.

22. The conveyance abnormality prediction system according to claim 13, wherein the learned model is generated by machine learning of teacher data in which a remaining time or a remaining number of times of transport from the time of the substrate transport to an occurrence time of conveyance abnormality is associated to a data set including sensor data at a time of substrate transport in a past, the estimation unit estimates the degree of conveyance abnormality by using as an input a data set including sensor data at a time of new substrate transport, based on the remaining time or the remaining number of times of transport predicted by the learned model, and the estimation unit outputs the estimated degree of conveyance abnormality.

23. The conveyance abnormality prediction system according to claim 13, wherein the learned model is generated by machine learning using a k-nearest neighbor algorithm while using, as teacher data, a data set including sensor data at a time of normal substrate transport in a past, the estimation unit estimates the degree of conveyance abnormality by using, as an input, a data set including sensor data at a time of new substrate transport and based on a distance to a k-nearest neighbor calculated by the learned model, and the estimation unit outputs the estimated degree of conveyance abnormality.

24. The conveyance abnormality prediction system according to claim 13, wherein the learned model is generated by machine learning by long short-term memory (LSTM) using, as teacher data, a data set including sensor data at a time of normal substrate transport in a past, the estimation unit calculates, by using as an input a data set including actual sensor data until a time of new substrate transport, a deviation between a data set including sensor data, at the time of the new substrate transport, predicted by the learned model from the data set including actual sensor data immediately before the time of the new substrate transport and a data set including actual sensor data at the time of the new substrate transport, and the estimation unit estimates the degree of conveyance abnormality, based on the deviation, and outputs the estimated degree of conveyance abnormality.

25. A learned model comprising:

an input layer including one or more nodes;

one or more intermediate layers including one or more nodes connected to the input layer; and an output layer including one or more nodes connected to the intermediate layers, wherein the learned model is generated by machine learning of a relationship between a data set including sensor data outputted at a time of substrate transport in a past and a degree of conveyance abnormality at the time of the substrate transport, by repeating a process of inputting to the input layer the data set including sensor data outputted, at the time of the substrate transport in the past, from each of a plurality of sensors provided on a substrate transport unit, comparing an output result outputted, due to the inputting, from the output layer with the degree of conveyance abnormality at the time of the substrate transport, and updating a parameter of each node of the one or more nodes of the one or more intermediate layers depending on an error of the comparison of the output result outputted from the output layer with the degree of conveyance abnormality at the time of the substrate transport, where the process is repeated with respect to a data set including sensor data at a plurality of the times of substrate transport in the past, and the learned model causes a computer to function such that, when a data set including sensor data outputted from each of the plurality of sensors at a time of new substrate transport is inputted to the input layer, a degree of conveyance abnormality at the time of the new substrate transport is estimated and the estimated degree of conveyance abnormality is outputted from the output layer.

* * * * *